US008666207B2

(12) United States Patent
Garmire

(10) Patent No.: US 8,666,207 B2
(45) Date of Patent: Mar. 4, 2014

(54) SYSTEM AND METHOD FOR COUPLING A MULTI-MODE OPTICAL FIBER TO A SINGLE MODE OPTICAL FIBER

(75) Inventor: Elsa Garmire, Hanover, NH (US)

(73) Assignee: The Trustees of Dartmouth College, Hanover, NH (US)

( * ) Notice: Subject to any disclaimer, the term of this patent is extended or adjusted under 35 U.S.C. 154(b) by 26 days.

(21) Appl. No.: 13/509,767

(22) PCT Filed: Nov. 12, 2010

(86) PCT No.: PCT/US2010/056535
§ 371 (c)(1), (2), (4) Date: Jul. 13, 2012

(87) PCT Pub. No.: WO2011/060261
PCT Pub. Date: May 19, 2011

(65) Prior Publication Data

US 2012/0281947 A1 Nov. 8, 2012

Related U.S. Application Data

(60) Provisional application No. 61/261,092, filed on Nov. 13, 2009.

(51) Int. Cl.
*G02B 6/26* (2006.01)

(52) U.S. Cl.
USPC .............................. 385/28; 385/33; 372/50.23

(58) Field of Classification Search
USPC ........................ 385/28, 35–38, 93; 372/50.23
See application file for complete search history.

(56) References Cited

U.S. PATENT DOCUMENTS

| | | | |
|---|---|---|---|
| 5,659,644 A | 8/1997 | DiGiovanni et al. | |
| 6,625,182 B1 | 9/2003 | Kuksenkov et al. | |
| 6,813,427 B1 | 11/2004 | Kaltenbacher et al. | |
| 7,106,928 B2 * | 9/2006 | Dykaar | 385/31 |
| 2003/0026312 A1 | 2/2003 | Clayton et al. | |
| 2007/0153859 A1 | 7/2007 | Muendel et al. | |

FOREIGN PATENT DOCUMENTS

WO 2007041507 A2 4/2007

OTHER PUBLICATIONS

International Search Report and Written Opinion issued in related PCT Patent Application PCT/US2010/056535, Jul. 27, 2011.

* cited by examiner

*Primary Examiner* — Mark Robinson
*Assistant Examiner* — Zachary A Nemtzow
(74) *Attorney, Agent, or Firm* — Lathrop & Gage LLP

(57) ABSTRACT

A multi-mode to single mode optical interface device includes an optically pumped edge emitting semiconductor laser device and a lens. The optically pumped edge emitting semiconductor laser device includes (1) a gain area, and (2) an edge located single mode output. The lens focuses a multi-mode optical fiber output beam into a substantially line shaped output beam focused onto the gain area of the optically pumped edge emitting semiconductor laser device. A method for converting a multi-mode optical signal into a single mode optical signal includes (1) focusing the multi-mode optical signal onto a gain area of an optically pumped edge emitting semiconductor laser using at least a line focusing lens, and (2) converting the multi-mode optical signal into the single mode optical signal using the semiconductor laser.

25 Claims, 7 Drawing Sheets

SYSTEM AND METHOD FOR COUPLING A MULTI-MODE OPTICAL FIBER TO A SINGLE MODE OPTICAL FIBER

CROSS-REFERENCE TO RELATED APPLICATIONS

This application claims benefit of priority to U.S. Provisional Patent Application No. 61/261,092 filed Nov. 13, 2009, which is incorporated herein by reference.

BACKGROUND

At least portions of current communication networks are typically electronic networks which are limited to electronic speeds. Higher speeds are possible by converting electrical network signals to optical signals, whereby photonic speeds are obtained. For a network to maximize its communication speed, an all-optical network is desirable, but limitations in current technology make this difficult. For example, efficient solutions for coupling a multi-spatial-mode optical fiber to a single spatial-mode optical fiber are limited.

SUMMARY

In an embodiment, a multi-mode to single mode optical interface device includes an optically pumped edge emitting semiconductor laser device and a lens. The optically pumped edge emitting semiconductor laser device includes (1) a gain area, and (2) an edge located single mode output. The lens focuses a multi-mode optical fiber output beam into a substantially line shaped output beam focused onto the gain area of the optically pumped edge emitting semiconductor laser device.

In an embodiment, a method for converting a multi-mode optical signal into a single mode optical signal includes (1) focusing the multi-mode optical signal onto a gain area of an optically pumped edge emitting semiconductor laser using at least a line focusing lens, and (2) converting the multi-mode optical signal into the single mode optical signal using the semiconductor laser.

DETAILED DESCRIPTION OF THE EMBODIMENTS

Figure 1:
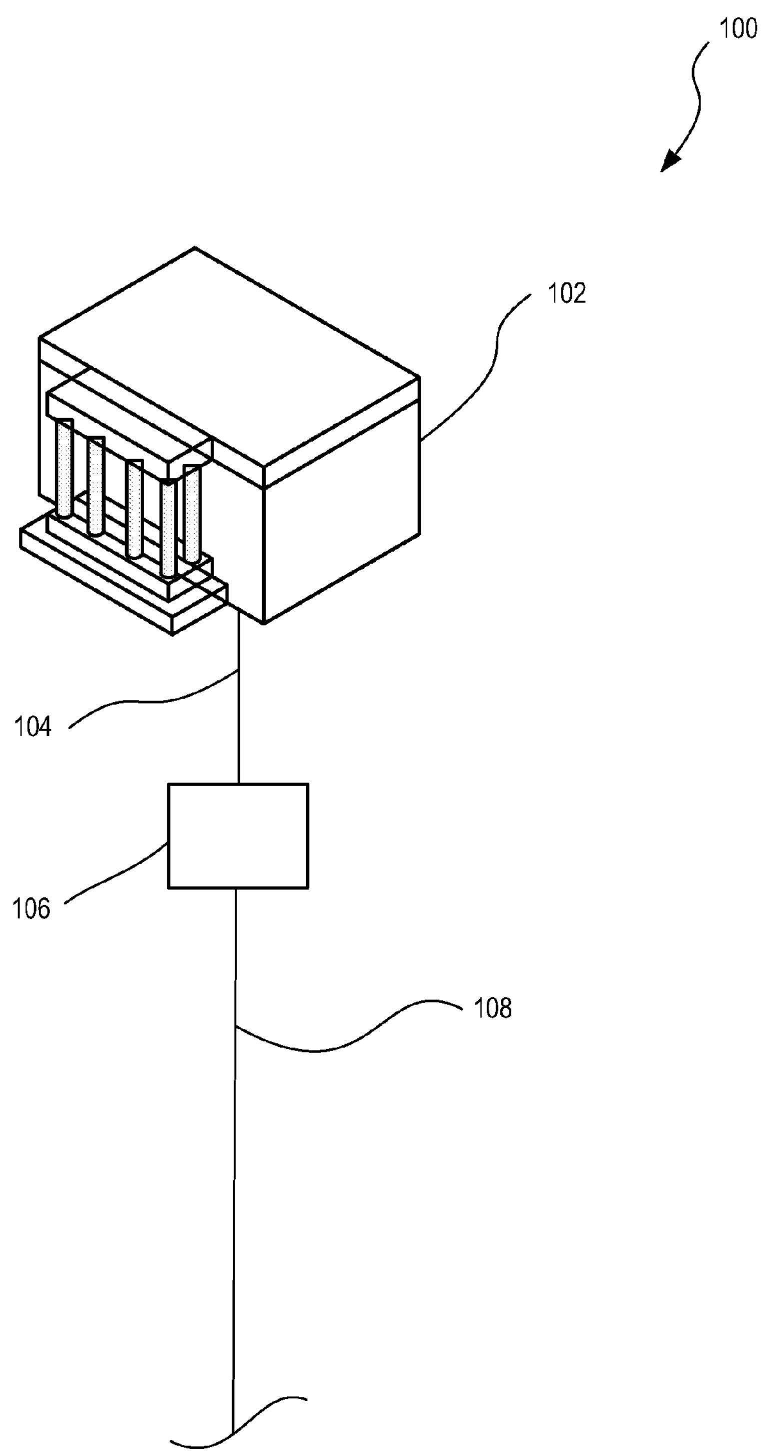
FIG. 1 shows a portion of an optical communication system providing optical communication to and from a building, in accord with an embodiment.

FIG. 1 shows a portion 100 of an optical communication system providing optical communication to and from a building 102. Portion 100 includes multi-mode optical fiber (MMOF) 104, multi-mode to single mode (MMSM) interface device 106, and single mode optical fiber (SMOF) 108. MMSM interface device 106 converts a multi-mode communication signal from MMOF 104 to a mode matched single mode communication signal for SMOF 108. In one example of operation, a multi-mode communication signal transmits from building 102 to MMSM interface device 106 via MMOF 104. MMSM interface device 106 converts the multi-mode communication signal into a single mode communication signal transmittable by single mode optical fiber 108. MMSM interface device 106 then provides the single mode communication signal to SMOF 108.

Multi-mode optical fibers are ideally used for transmitting communication signals over short distances, for example within an office building, dormitory, or on a campus (e.g., building 102). The large light gathering capacity of a multi-mode optical fiber's large core (typically 50 μm or 62.5 μm) allows for multimode optical fibers to be used with low cost LED and vertical-cavity surface-emitting laser (VCSEL) sources. The multi-mode optical fiber's large core has a drawback; it supports a plurality of propagation modes that cause signal degradation over long distances (e.g., several kilometers).

Single mode optical fibers are typically designed with core diameters in the range of 8 μm-10 μm. A drawback to a single mode optical fiber's smaller core is its reduced size as compared to a core of a multi-mode optical fiber. This makes the core of the single mode optical fiber a difficult target for an optical source (e.g., LED, VCSEL) to hit, possibly requiring more precise, and expensive optical sources.

Figure 2:
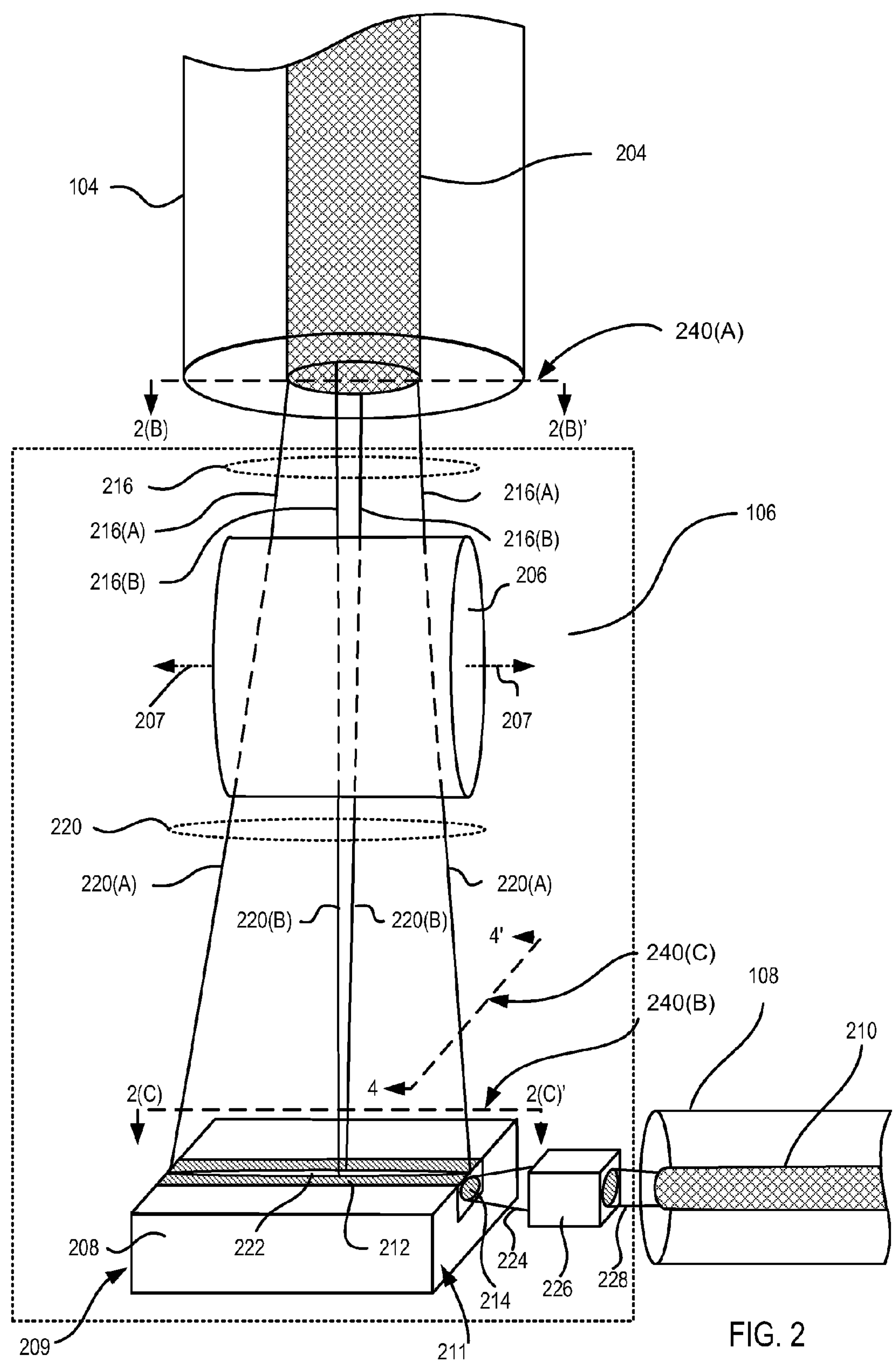
FIG. 2 shows a perspective view of a multi-mode to single mode optical interface device, in accord with an embodiment.

FIG. 2 is an illustrative representation of a multi-mode to single mode interface device 106. Interface device 106 includes a lens 206, an optically pumped edge emitting semiconductor laser 208, and an optional mode coupler 226. In this example, lens 206 has a cylindrical axis 207. Semiconductor laser 208 includes a gain area 212 and an emitting region 214. Emitting region 214 is an edge located single mode output. MMOF 104 and SMOF 108 have MMOF core 204 and SMOF core 210 respectively. The elements shown in FIG. 2 may not be drawn to scale.

Figure 3:
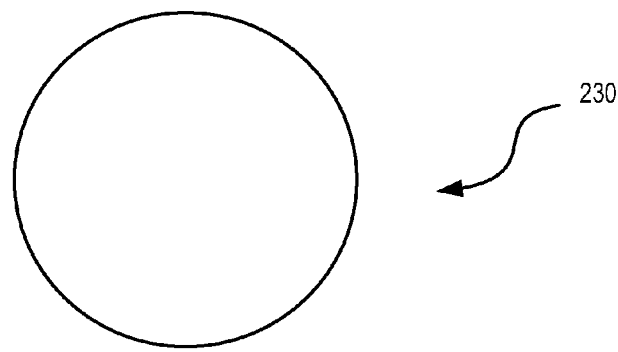
FIG. 3 shows a cross sectional view of a multi-mode optical fiber output signal's circular cross sectional shape, in accord with an embodiment.
Figure 4:
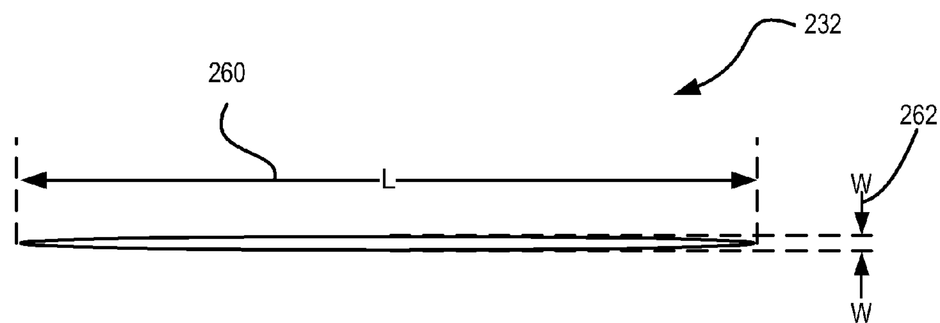
FIG. 4 shows a cross sectional view of a line focused optical signal's cross sectional shape, in accord with an embodiment.
Figure 5:
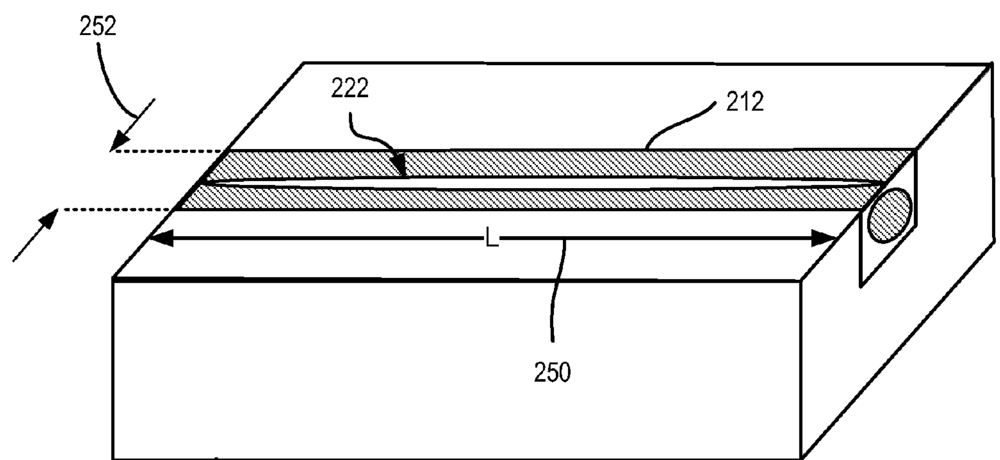
FIG. 5 shows a detailed view of an edge emitting semiconductor laser with a gain area length and gain area width shown, in accord with an embodiment.

FIG. 3 shows a cross section 230 of multi-mode optical fiber (MMOF) output signal 216 at location 240(A), which is at the termination of MMOF 104. Cross section 230 is a circular cross section with its length and width being equal. FIG. 4 shows a cross section 232 of MMOF output 222 at location 240(B), which is at the surface of gain area 212, but is shown above gain area 212 to maintain illustrative clarity. Cross section 232 has a cross sectional length 260 and a cross sectional width 262. In contrast to cross section 230, FIG. 3, cross section 232 is substantially line shaped, and has a length 260 that is longer than cross section 230 and a width 262 that is smaller than cross section 232. In the context of this disclosure and corresponding claims, substantially line shaped means that a length of the shape is greater than a width of the shape. In one embodiment, width 262 is approximately 10 micrometers, and length 260 ranges from approximately 100 to 500 micrometers. FIG. 5 is a perspective view of semiconductor laser 208 showing a length 250 and a width 252 of gain area 212. MMOF output 222 is shown on gain area 212. FIGS. 2, 3 and 4 are meant to be viewed in combination.

Interface device 106 utilizes a semiconductor laser 208 to convert a MMOF output signal 216 from MMOF 104 to an output beam, single mode communication signal 224, for transmission via SMOF 108. In operation, MMOF 104 outputs a MMOF output signal 216, which exits MMOF 104 with a circular cross section, shown as cross sectional 230, FIG. 3. As optical output 216 travels away from MMOF 104, cross section 230 of optical output 216, having a circular shape, expands, due to a multi-mode optical fiber's conical exit angle, as known in the art. Interface device 106 makes use of this phenomenon by utilizing a line focusing lens, cylindrical lens 206.

Cylindrical lens 206 line focuses MMOF output signal 216 into a line focused output signal 220. Lens 206 has a focusing capacity that is maximized near cylindrical lens 206's surface in the plane parallel to gain area 212, and goes to zero at cylindrical lens 206's cylindrical axis 207. Signal rays 220 (A) designate the outermost points along the length of output signal 220 after exiting lens 206. Output signal 216 typically has a wavelength of either 850 nm or 1300 nm, although other wavelengths are possible.

Output signal 220 terminates at gain area 212 as line focused MMOF output 222. Conical expansion of signal rays 216(A) and 220(A) is utilized in substantially matching cross sectional length 260 of MMOF output 222 with gain area length 250 of gain area 212. Cylindrical lens 206 focuses signal rays 220(B) inward, substantially matching cross sectional width 262 of cross section 232 of FIG. 4 to gain area width 252, FIG. 5, of gain area 212. Signal rays 220(B) designate the outer most points along the width of output signal 220. In this example, substantially matching means matching within ±35%.

Wavelength conversion and single mode optical fiber matching are provided by optically pumped edge emitting semiconductor laser 208, where a desired wavelength conversion is accomplished by selecting semiconductor laser 208 with an appropriate band gap. Semiconductor laser 208 absorbs line focused MMOF output 222 at gain area 212 and emits, at emitting region 214, a single mode communication signal 224 having a wavelength greater than output signal 216, 220. Both single mode optical signal 224 and MMOF output signal 216 therefore contain the same signal, but each is wavelength matched to its respective fiber optic transmission medium, that is, SMOF 108 and MMOF 104 respectively.

Gain area 212 may be a layer growth optimized for optical pumping with properly spaced facets, as known in the art. In one example, the facet opposing emitting region 214 supports a mirror, such as a mirror coating (e.g., a cleaved facet, a dielectric mirror or any frequency dependent reflective material), for optimizing power output at the emitting region 214 facet (e.g., for increasing power output of semiconductor laser 208). In another example, the layer growth farthest from gain area 212 of laser 208 supports a mirror, such as mirror coating, for optimizing absorption of line focused MMOF output 222. A typical wavelength of single mode communication signal 224 is either 1310 nm or 1550 nm, although other wavelengths are possible.

The dimensional area of emitting region 214 (e.g., approximately 32 $\mu m^2$) is preferably, but not necessarily, equal to the cross sectional area of SMOF core 210 (e.g., 50 $\mu m^2$ to 80 $\mu m^2$), such that at least a large portion, if not all, of single mode communication signal 224 enters SMOF core 210. Emitting region 214 has an area that may be, for example, approximately 4 μm×8 μm for matching to a SMOF core 210 having a diameter about 8-10 μm.

In the present embodiment, the portion of light from emitting region 214 that enters SMOF core 210 can be increased by use of mode coupler 226 for mode matching single mode communication signal 224 to SMOF core 210. Mode couplers are known in the art, and one example of mode coupler 226 is an aspheric lens with two different focal lengths in the two different dimensions whereby a mode matched signal 228 entering SMOF core 210 is circularly symmetric with the diameter of SMOF core 210 (e.g., 8-10 μm).

As an alternative to use of mode coupler 226, SMOF core 210 may have an optically transparent, curved face (e.g., a lens feature, not shown) for mode matching single mode communication signal 224 to SMOF core 210. The curved face may be utilized, for example, when the dimensional area of emitting region 214 is similarly sized or larger than the cross sectional area of SMOF core 210 for focusing signal 224 into SMOF core 210.

Semiconductor laser 208 is, for example, cleaved from a wafer such that the end facets 209, 211 have the natural reflectivity of the semiconductor material. In another embodiment, end facet 209 is coated with a highly reflective material to maximize optical output at emitting region 214. In yet another embodiment, end facet 211 may be coated with a material having a high reflectivity, for example, a multiple dielectric mirror, designed to lower the threshold. In yet another embodiment, end facet 211 may be coated with a material having a low reflectivity, to speed up the response of semiconductor laser 208 to MMOF output 222 on gain area 212.

Lens 206 is a substantially line focusing lens, whereby an optical signal having a circular cross section, for example cross section 230 of FIG. 3, passes through lens 206 and is focused into a substantially line shaped cross section, for example cross section 232 of FIG. 4. Lens 206 focuses divergent signal rays 216(B), and outputs convergent signal rays 220(B). Convergent signal rays 220(B) terminate at MMOF output 222 where output 222's width is greatest, shown as cross sectional width 262, FIG. 4. No focusing occurs along MMOF output 222'*s* length, shown as cross sectional length 260, FIG. 4. The focusing of convergent signal rays 220(B) is determined in part by the shape, size, material properties of lens 206 and the distance lens 206 is from gain area 212. Lens 206 has little effect on divergent signal rays 216(A). Therefore lens 206 reshapes MMOF output signal 216 from a circular cross section (see FIG. 3) into MMOF output 222 having a substantially line shaped cross section (see FIG. 4).

Lens 206 is shown as one cylindrical lens, but may be another suitable line focusing lens or lenses, such as a half cylinder lens. Lens 206 may be fabricated from, for example, BK7 glass, crown glass, flint glass and amorphous polyolefin. In the present embodiment, the distance of lens 206 from active gain area 212 is selected based on a focal length of lens 206. In another embodiment, one or more additional lenses, for example, spherical lenses, may be used to match cross sectional length 260 with gain area length 250.

Figure 6:
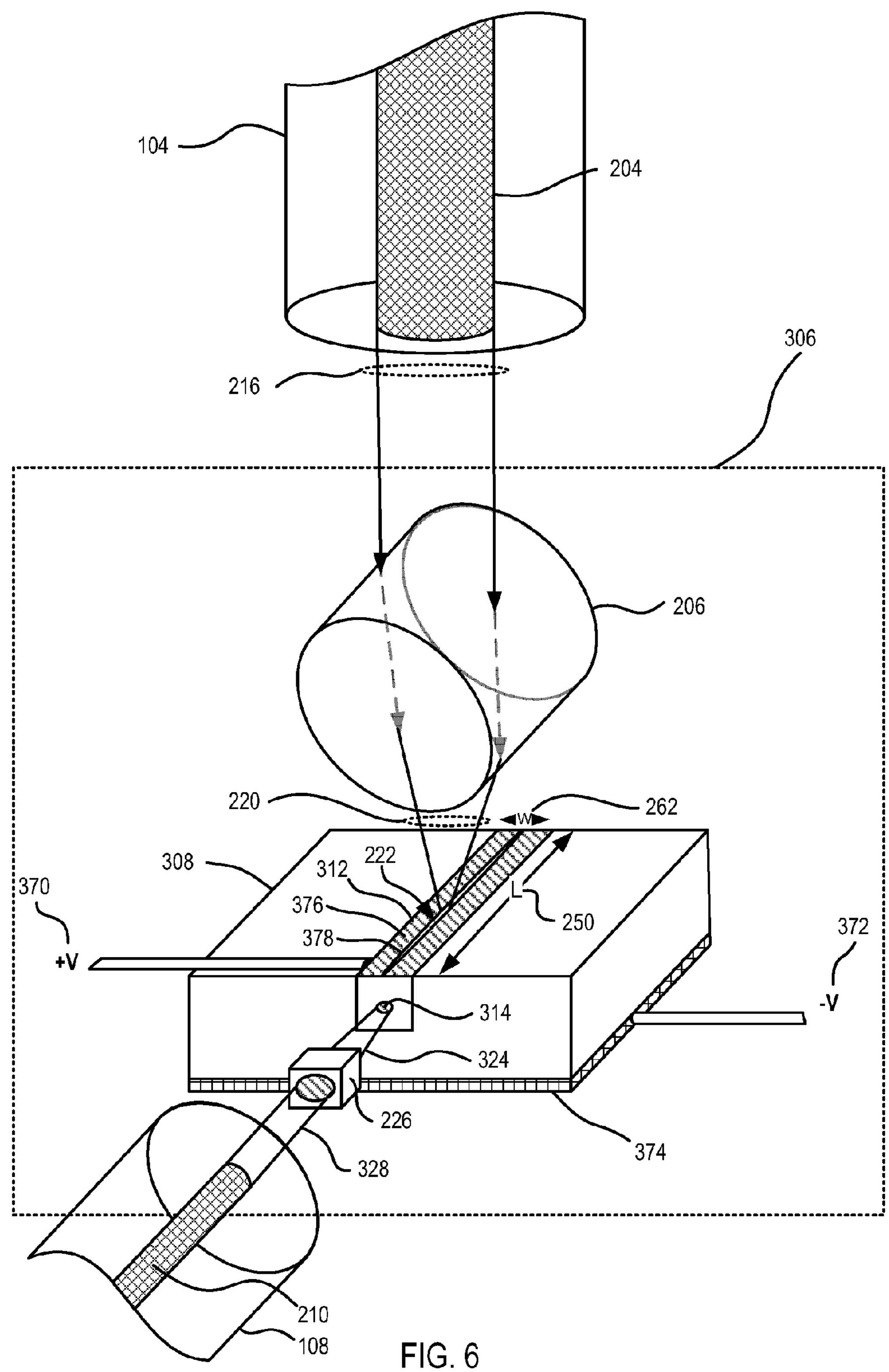
FIG. 6 shows a perspective view of an active multi-mode to single mode optical interface device, in accord with an embodiment.

FIG. 6 is a front perspective view of an active MMSM interface device 306. Active device 306 is similar to interface device 106, with the addition of an electrical bias shown schematically by bias connections 370 and 372. Optically pumped edge emitting semiconductor laser 308 is similar to semiconductor laser 208 but includes electrical biasing. Active gain area 312 can be seen as similar to gain area 212 and active emitting region 314 can be seen as similar to emitting region 214. Active MMSM interface device 306 is typically thermally coupled to a heat sink for cooling active MMSM interface device 306.

Line focusing MMOF output 222 onto active gain area 312 stimulates semiconductor laser 308. In the present embodiment, active gain area 312 is partially covered by a metallic contact 376 having an opening 378 etched therein, the etched opening 378 is sized to allow MMOF output 222 to pass through the metallic contact 376 substantially unimpeded. The underside of semiconductor laser 308 may be covered by a metal ohmic contact 374. Semiconductor laser 308, stimulated by MMOF output 222 and biased through connection 370, connected to metallic contact 376, and connection 372, connected to metallic contact 374, edge emits an amplified single mode optical signal (SMOS) 324 from active emitting region 314. Amplified SMOS 324 is therefore an amplified version of single mode optical signal 224, FIG. 2. In the present embodiment, mode coupler 226, described in FIG. 2, is used to change SMOS 324 to mode match signal 328 for coupling to SMOF 210. In another embodiment (not shown), mode coupler 226 is not present and active emitting region 314 is sized such that it is smaller than SMOF core 210 to facilitate mode coupling of amplified SMOS 324 from active emitting region 314 to SMOF core 210.

In a separate embodiment, metallic contact 376, which covers active gain area 312, may be replaced by a transparent dielectric, such as indium tin oxide.

In another embodiment, the mode-coupler 226 may be a lens situated between active emitting region 314 and SMOF core 210 to increase the transmission of SMOS 324 into SMOF core 210. This lens may be aspheric, such as often used in state-of-the-art coupling between a laser and a single mode fiber. The lens may be designed to focus both the width and depth of SMOS 324 into the appropriate dimensions and mode angle to match the circular mode of the SMOF core 210.

In another embodiment, semiconductor laser 308 is semiconductor diode laser operated below threshold to provide increased output power. The semiconductor laser diode 308 is held below threshold by electrically biasing active gain area 312. Electrical biasing is provided by bias connections 370 and 372. In the presence of a line focused MMOF output 222 on active gain area 312, the semiconductor laser diode 308 is driven into laser operation.

Figure 7:
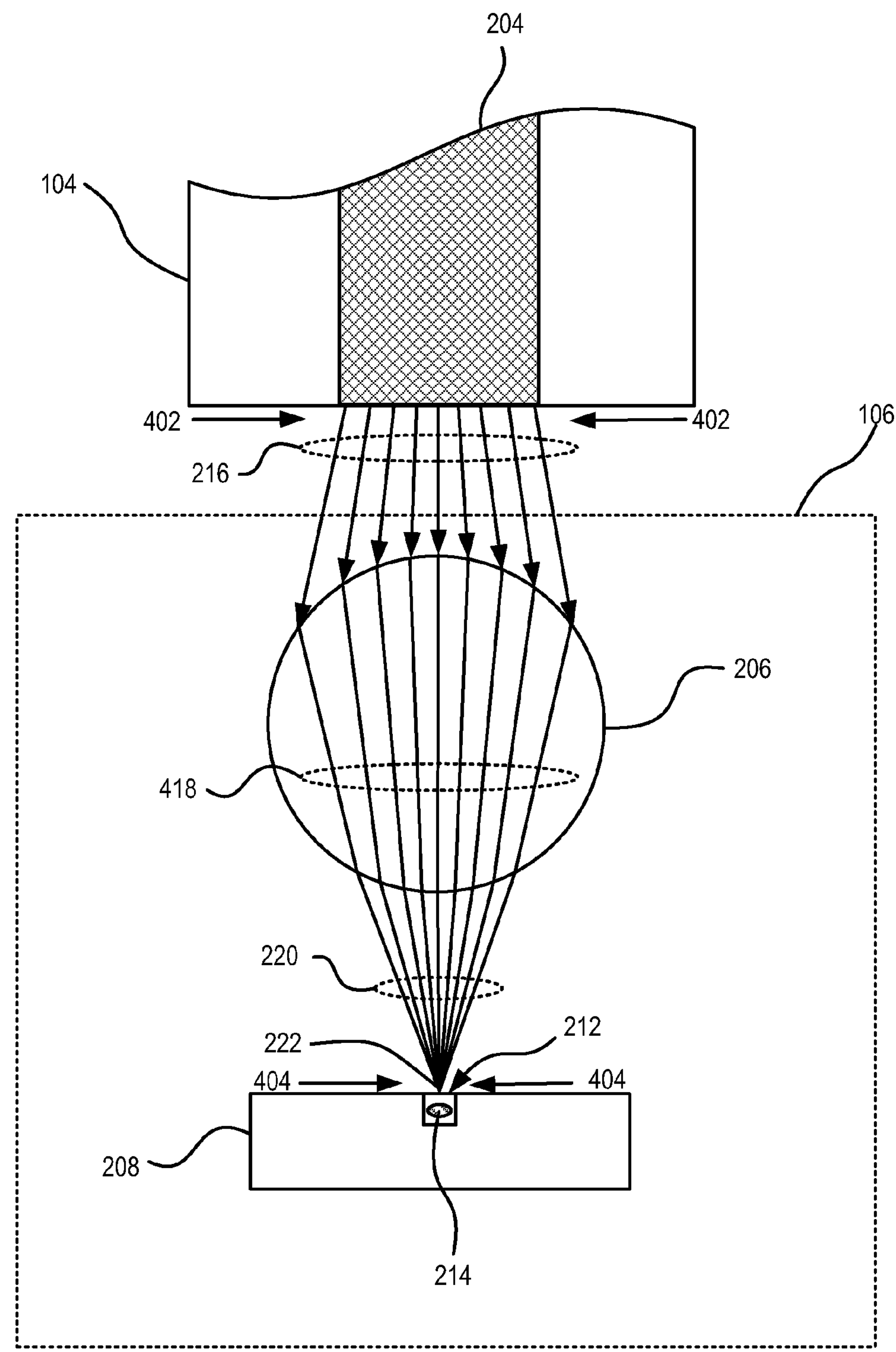
FIG. 7 shows a cross sectional view of the multi-mode to single mode optical interface device of FIG. 2, in accord with an embodiment.

FIG. 7 is an illustrative representation showing a cross sectional view at location 240(C) of MMSM interface device 106, FIG. 2. FIG. 7 shows the focusing of the MMOF output signal 216 into MMOF output 222. A width of MMOF core 204 may be any size fiber optic core width, but is typically 50 μm or 62.5 μm. Upon exiting MMOF core 204, MMOF output signal 216 has a signal width 402, and then typically spreads, as shown by the diverging lines of MMOF output signal 216. Upon entering lens 206, the divergent angle of MMOF output signal 216 is bent inward as shown by MMOF output signal 418 within lens 206. MMOF output signal 418 is shown converging, but may be divergent, although less so than MMOF output signal 216, or may be substantially collimated. Upon exiting lens 206, MMOF output signal 418 again bends inward as shown by MMOF output signal 220. MMOF output signal 220 is line focused onto gain area 212 as line focused MMOF output 222. Line focused MMOF output 222 has a line focused width 404 ideally less than or equal to the width 252 of gain area 212 (e.g., 8 μm). An intermediary lens may be situated between lens 206 and semiconductor laser 208 to match focused width 404 to the width of gain area 212 (e.g., gain area width 252, FIG. 5).

Figure 8:
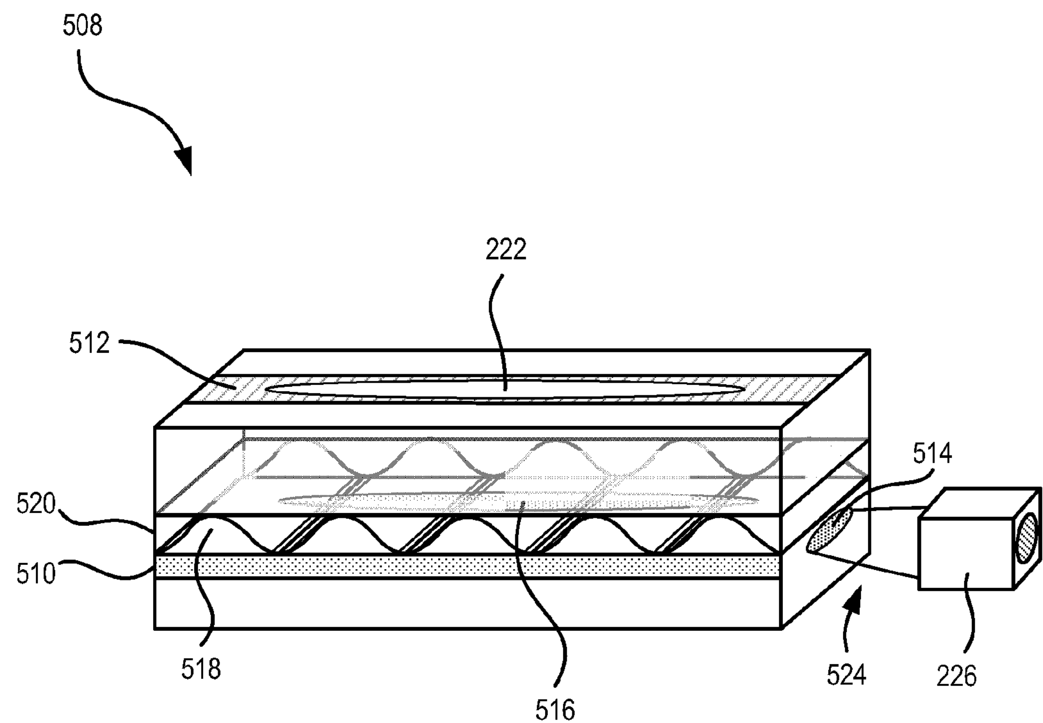
FIG. 8 shows an alternative semiconductor laser, in accord with an embodiment

FIG. 8 is an illustrative representation showing one alternative semiconductor laser, a Distributed Feedback (DFB) Laser. In an embodiment, a DFB laser 508 takes the place of semiconductor laser 208 within MMSM interface device 106, FIG. 2. It will be appreciated that while FIG. 8 shows one example of a DFB laser, other lasers based on the DFB principle may alternatively be used without departing from the scope hereof. DFB laser 508 includes a gain area 512, similar to gain are 212 (FIG. 2), on which MMOF output 222 (FIG. 2) is focused, a grating layer 520 having a Bragg grating 518 therein, an active layer 510 having a pumping region 516 and an emitting region 514, similar to emitting region 214 (FIG. 2). Emitting region 214 emits a single mode signal 524, similar to single mode signal 224 (FIG. 2). Single mode signal 524 is generated within active layer 510. Similar to FIG. 2, an optional mode coupler 226 may be used to increase the amount of single mode signal 524 entering into a SMOF core 210 (not shown).

In the example of FIG. 8, DFB laser 508 is fixed wavelength single mode diode laser. The fixed wavelength is determined by selecting an appropriate Bragg grating 518 frequency within grating layer 520, a technique well know in the art. Grating layer 520 is located proximate to active layer 510 such that Bragg grating 518 frequency selected photons interact with active layer 510 at pumping region 516. Pumping region 516 of active layer 510 is activated by the portion of gain area 512 absorbed MMOF output 222, which is selectively reflected onto active layer 510. These selectively reflected photons participate in generating single mode signal 524 generated within active layer 510 and emitted from emitting region 514.

Figure 9:
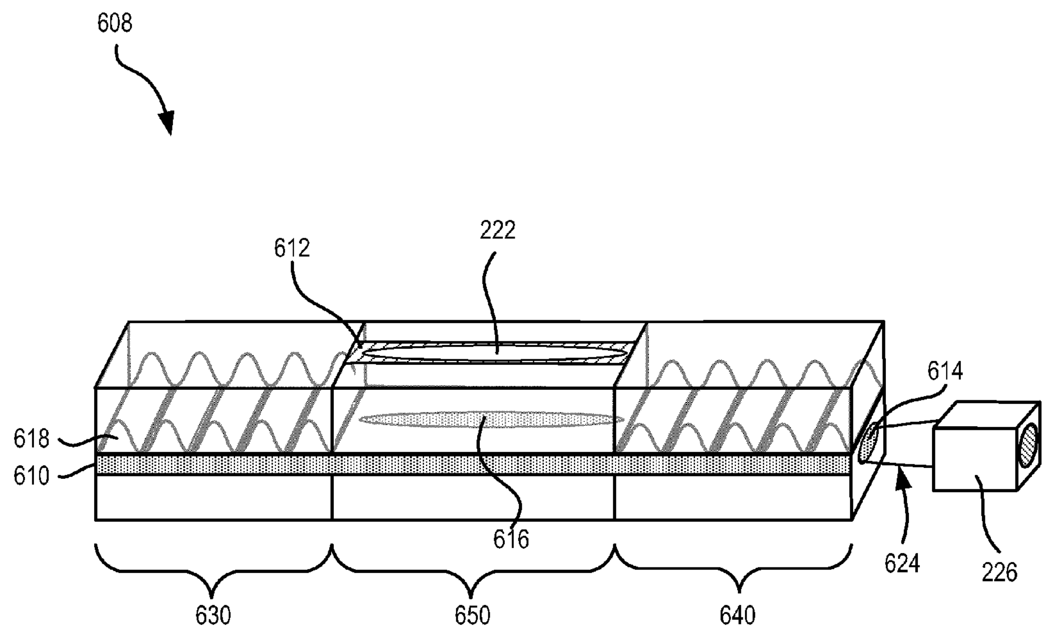
FIG. 9 shows another alternative semiconductor laser, in accord with an embodiment.

FIG. 9 shows one illustrative representation of another alternative semiconductor laser, a Distributed Bragg Reflector (DBR) Laser. In an embodiment, a DFB laser 608 takes the place of semiconductor laser 208 within MMSM interface device 106, FIG. 2. It will be appreciated that while FIG. 9 shows one example of a DBR laser, other lasers based on the DBR principle may alternately by used without departing from the scope hereof. In the example of FIG. 9, DBR Laser 608 includes two Bragg grating portions 630, 640 and a gain portion 650. For sake of clarity, only the elements of Bragg grating portion 630 are labeled in FIG. 9. It will be appreciated that Bragg grating portions 630 and 640 are substantially the same to within manufacturing tolerances. Bragg grating portion 630 is shown with an illustrative representation of a Bragg grating 618. The Bragg grating within Bragg grating portion 630, 640 frequency select the signal emitted from emitting region 614. Active layer 610 spans the length of grating portion 630, active portion 650 and grating portion 640. In operation, MMOF output 222 is absorbed at gain area 612. Absorbed MMOF output 222 activates active layer 610 at pumping region 616. A signal generated within active region 650 is frequency selected by adjacent Bragg grating portions 630 and 640, typical of a Distributed Bragg Reflector Laser known in the art. The frequency selected signal is emitted as single mode signal 624 from emitting region 614. Single mode signal 624 may optionally be coupled with SMOF core 210 (not shown) by means of optional mode coupler 226.

In one embodiment, the DBR laser includes one Bragg grating portion, for example, Bragg grating portion 630 such that Bragg grating portion 640 is omitted.

In another embodiment, DBR laser additionally includes a phase portion (not shown) for cooperating with one or more Bragg grating portion 630, 640 to tune the frequency of the output signal to form a tunable Distributed Bragg Reflector Laser, known in the art.

Figure 10:
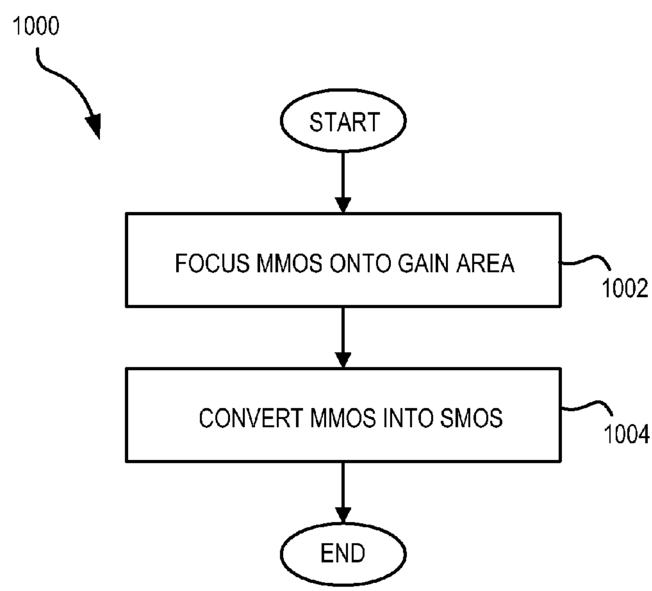
FIG. 10 shows a method for converting a multi-mode optical signal into a single mode optical signal, in accord with an embodiment.

FIG. 10 shows a method 1000 for converting a multi-mode optical signal (MMOS) into a single mode optical signal (SMOS). Method 1000 begins with a step 1002 of focusing the MMOS onto a gain area of an optically pumped edge emitting semiconductor laser using at least a line focusing lens. An example of step 1002 is focusing MMOF output signal 216 onto gain area 212 of semiconductor laser 208 using lens 206 (FIG. 2). In step 1004, the MMOS is converted into the SMOS using the optically pumped edge emitting semiconductor laser. An example of step 1004 is using laser 208 to convert line focused MMOF output 222 into single mode communication signal 224.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A multi-mode to single mode optical interface device, comprising:

an optically pumped edge emitting semiconductor laser device including;

(1) a gain area, and (2) an edge located single mode output; and a lens for focusing a multi-mode optical fiber output beam into a substantially line shaped output beam focused onto the gain area of the optically pumped edge emitting semiconductor laser device.

2. The interface device of claim 1, wherein the edge emitting semiconductor laser device is electrically biased such that a power of an output beam emitted by the edge located single mode output is greater than a power of the substantially line shaped output beam focused onto the gain area.

3. The interface device of claim 1, wherein a cross section of the substantially line shaped output beam at the gain area has a width and length substantially matching a respective width and length of the gain area.

4. The interface device of claim 3, wherein the substantially line shaped output beam has a width of approximately 10 micrometers and a length ranging from approximately 100 to 500 micrometers.

5. The interface device of claim 1, wherein the edge located single mode output is coupled to a single mode optical fiber.

6. The interface device of claim 5, wherein the edge located single mode output emits an output beam which is mode matched to the single mode optical fiber.

7. The interface device of claim 5, wherein the edge located single mode output emits an output beam, and the output beam is mode matched to the single mode optical fiber by a curved face of the single mode optical fiber.

8. The interface device of claim 5, wherein the edge located single mode output emits an output beam, and the output beam is mode matched to the single mode optical fiber by a mode-matching coupler.

9. The interface device of claim 8, wherein the mode-matching coupler comprises one or more lenses.

10. The interface device of claim 5, wherein the edge located single mode output has a dimensional area smaller than a cross sectional area of a core of the single mode optical fiber.

11. The interface device of claim 1, wherein the semiconductor laser device is a semiconductor diode laser operated below threshold to increase output power of the semiconductor laser device.

12. The interface device of claim 1, wherein the gain area is a layer growth optimized for optical pumping with properly spaced facets.

13. The interface device of claim 12, wherein at least one facet is coated with one or more mirrors to Increase power of a signal accepted by a single mode optical fiber coupled to the edge located single mode output.

14. The interface device of claim 12, further comprising a mirror disposed below the gain area to reflect the substantially line shaped output beam such that a reflected line shaped output beam interacts with the gain area, thereby increasing output power of the semiconductor laser device.

15. The interface device of claim 1, wherein the lens is a cylindrical lens.

16. The interface device of claim 1, wherein the lens is a lens system comprising a plurality of lenses.

17. The interface device of claim 16, wherein the plurality of lenses comprise:

a cylindrical lens for focusing the multi-mode optical fiber output beam into the substantially line shaped output beam; and one or more spherical lenses for focusing the substantially line shaped output beam onto the gain area such that a cross section of the substantially line shaped output beam at the gain area has a length equal to a length of the gain area.

18. The interface device of claim 1, wherein the edge located single mode output has an emitting area of approximately 4 micrometers by 8 micrometers.

19. The interface device of claim 1, wherein the optically pumped edge emitting semiconductor laser device is a Distributed Feedback Laser.

20. The interface device of claim 1, wherein the optically pumped edge emitting semiconductor laser device is a Distributed Bragg Reflector Laser having one or more Bragg grating portions.

21. The interface device of claim 20, wherein the Distributed Bragg Reflector Laser is a tunable Distributed Bragg Reflector Laser.

22. A method for converting a multi-mode optical signal (MMOS) into a single mode optical signal (SMOS), comprising:

focusing the MMOS onto a gain area of an optically pumped edge emitting semiconductor laser using at least a line focusing lens; and converting the MMOS into the SMOS utilizing the optically pumped edge emitting semiconductor laser.

23. The method of claim 22, the step of focusing comprising using a cylindrical lens.

24. The method of claim 22, further comprising electrically biasing the semiconductor laser such that the SMOS has a power greater than a power of the MMOS.

25. The method of claim 22, further comprising mode-matching the SMOS to a single mode optical fiber.

* * * * *